United States Patent
Kim et al.

(10) Patent No.: US 7,580,294 B2
(45) Date of Patent: Aug. 25, 2009

(54) SEMICONDUCTOR MEMORY DEVICE COMPRISING TWO ROWS OF PADS

(75) Inventors: Du-yeul Kim, Suwon-si (KR); Won-il Bae, Seongnam-si (KR); Yong-gyu Chu, Seoul (KR); Jun-hyung Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 207 days.

(21) Appl. No.: 11/702,093

(22) Filed: Feb. 5, 2007

(65) Prior Publication Data

US 2007/0189083 A1 Aug. 16, 2007

(30) Foreign Application Priority Data

Feb. 13, 2006 (KR) .................. 10-2006-0013767

(51) Int. Cl.
*G11C 7/10* (2006.01)

(52) U.S. Cl. .............. 365/189.02; 365/191; 365/193; 365/230.01; 365/230.02

(58) Field of Classification Search ............ 365/189.02, 365/230.02, 189.03, 191, 193, 230.01
See application file for complete search history.

(56) References Cited

U.S. PATENT DOCUMENTS 5,528,549 A * 6/1996 Doddington et al. ... 365/230.03
5,586,078 A * 12/1996 Takase et al. .......... 365/230.03
6,335,889 B1 * 1/2002 Onodera ................. 365/221
2005/0276146 A1 * 12/2005 Ha et al. ................ 365/230.03

FOREIGN PATENT DOCUMENTS

| KR | 10-1999-0049861 | 7/1999 |
| KR | 10-2000-0015348 A | 3/2000 |
| KR | 100275724 B1 | 9/2000 |
| KR | 1020020032022 A | 5/2002 |
| KR | 1020030046715 A | 6/2003 |
| KR | 1020030094667 A | 12/2003 |
| KR | 10-2005-0066502 A | 6/2005 |

* cited by examiner

*Primary Examiner*—Pho M. Luu
(74) *Attorney, Agent, or Firm*—Volentine & Whitt, PLLC

(57) ABSTRACT

A semiconductor memory device includes a first row of pads including a first plurality of data input/output (I/O) pads; a second row of pads including a second plurality of data I/O pads; and a first I/O multiplexer associated with the first row of pads and providing first output data only to at least one data I/O pad of the first row of pads, even after a data I/O mode of the semiconductor memory device has changed. The semiconductor memory device also includes a second I/O multiplexer associated with the second row of pads and providing second output data only to at least one data I/O pad of the second row of pads, even after the data I/O mode has changed.

20 Claims, 4 Drawing Sheets

SEMICONDUCTOR MEMORY DEVICE COMPRISING TWO ROWS OF PADS

BACKGROUND

1. Field of the Invention

Embodiments of the invention relate to a semiconductor memory device. In particular, embodiments of the invention relate to a semiconductor memory device comprising two rows of pads.

This application claims priority to Korean Patent Application No. 10-2006-0013767, filed on Feb. 13, 2006, the subject matter of which is hereby incorporated by reference in its entirety.

2. Description of Related Art

A semiconductor memory device can simultaneously input multiple bits of data to or simultaneously output multiple bits of data from a memory cell array in accordance with a data input/output mode of the semiconductor memory device. For example, when the data input/output mode of a semiconductor memory device is a ×4 mode, the semiconductor memory device simultaneously inputs or outputs four bits of data, and when the data input/output mode of a semiconductor memory device is a ×8 mode, the semiconductor memory device simultaneously inputs or outputs eight bits of data. A single semiconductor memory device can operate in any one of a plurality of data input/output modes, and the mode in which the semiconductor memory device operates may depend on whether a pad of a memory chip in the semiconductor memory device was bonded to a package pin of the semiconductor memory device during the fabrication of the semiconductor memory device.

Figure (FIG.) 1 shows a conventional semiconductor memory device.

Referring to FIG. 1, a conventional semiconductor memory device 1 comprises a first row of pads 10, a second row of pads 20, a first input/output multiplexer 30 associated with first row of pads 10, and a second input/output multiplexer 40 associated with second row of pads 20. The data input/output mode in which first and second input/output multiplexers 30 and 40 operate changes in response to an input/output mode control signal PX.

However, in the related art, the row of pads, among first and second rows of pads 10 and 20, to which data DATA0 (which is stored in a memory cell array) is output may be changed in accordance with the data input/output mode. For example, as shown in FIG. 1 and illustrated by different types of arrows, data DATA0 is output to first row of pads 10 in the ×4 mode. Alternatively, data DATA0 may be output to second row of pads 20 in the ×8 mode.

Therefore, in conventional semiconductor memory device 1, it is necessary for first input/output multiplexer 30 to be electrically connected to second row of pads 20 as well as first row of pads 10, and it is necessary for second input/output multiplexer 40 to be electrically connected to first row of pads 10 as well as second row of pads 20. For example, a vertical bus 50 may be formed between first input/output multiplexer 30 and second input/output multiplexer 40 in order to connect the multiplexers. When data passes through vertical bus 50, additional loading is performed compared to when data does not pass through vertical bus 50. Thus, data input/output characteristics (for example, a frequency characteristic) of conventional semiconductor memory device 1 may suffer (i.e., deteriorate).

SUMMARY

Embodiments of the invention provide a semiconductor memory device adapted to output data without using a vertical bus connecting first and second input/output multiplexers in order to provide a semiconductor memory device having improved data input/output characteristics.

In one embodiment, the invention provides a semiconductor memory device comprising a first row of pads comprising a first plurality of data input/output pads disposed in a row direction; a second row of pads physically separated from the first row of pads and comprising a second plurality of data input/output pads disposed the row direction; and a first input/output multiplexer associated with the first row of pads and adapted to provide first output data only to at least one data input/output pad of the first row of pads, even after a data input/output mode of the semiconductor memory device has changed. The semiconductor memory device further comprises a second input/output multiplexer associated with the second row of pads and adapted to provide second output data only to at least one data input/output pad of the second row of pads, even after the data input/output mode has changed.

In another embodiment, the invention provides a semiconductor memory device comprising a first row of pads comprising a first plurality of data input/output pads disposed in a row direction; a second row of pads physically separated from the first row of pads and comprising a second plurality of data input/output pads disposed the row direction; a first input/output multiplexer electrically connected to the first row of pads and electrically disconnected from the second row of pads; and a second input/output multiplexer electrically connected to the second row of pads and electrically disconnected from the first row of pads.

In still another embodiment, the invention provides a semiconductor memory device comprising a first row of pads comprising a first plurality of data input/output pads disposed in a row direction; a second row of pads physically separated from the first row of pads and comprising a second plurality of data input/output pads disposed the row direction; and a data input/output mode control circuit adapted to generate a data input/output mode control signal in response to a voltage signal supplied from outside of the data input/output mode control circuit. The semiconductor memory device further comprises a first input/output multiplexer adapted to receive the data input/output mode control signal and, in response to the data input/output mode control signal, switch from providing data to a first set of at least one data input/output pad of the first row to providing data to a second set of at least one data input/output pad of only the first row; and a second input/output multiplexer adapted to receive the data input/output mode control signal and, in response to the data input/output mode control signal, switch from providing data to a first set of at least one data input/output pad of the second row to providing data to a second set of at least one data input/output pad of only the second row.

BRIEF DESCRIPTION OF THE DRAWINGS

Embodiments of the invention will be described herein with reference to accompanying drawings, in which like reference symbols indicate like elements throughout. In the drawings.

DESCRIPTION OF EMBODIMENTS

Figure 1:
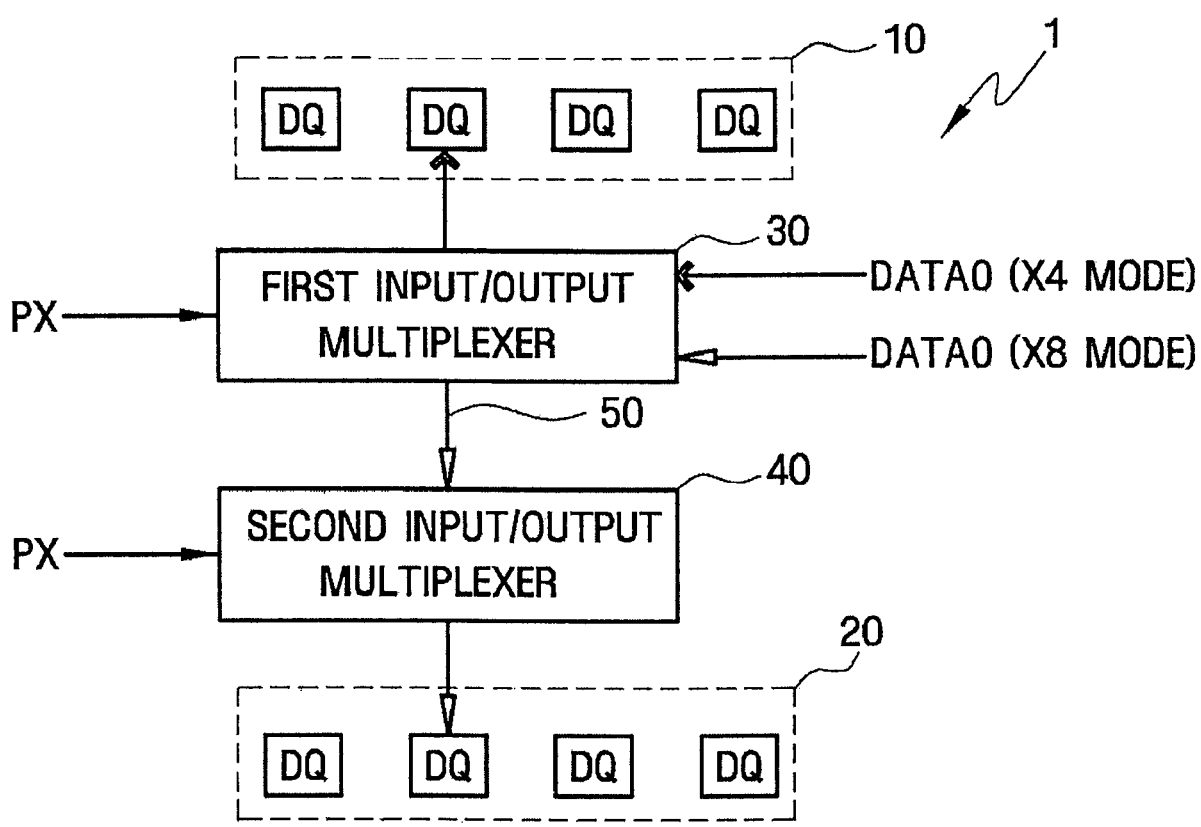
FIG. 1 shows a conventional semiconductor memory device.
Figure 2:
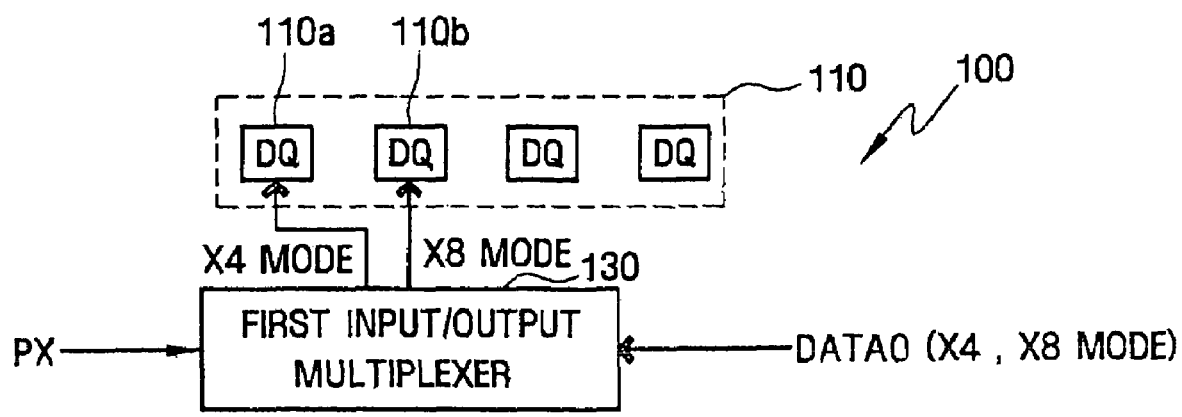
FIG. 2 shows a semiconductor memory device in accordance with an embodiment of the invention.
Figure 2:
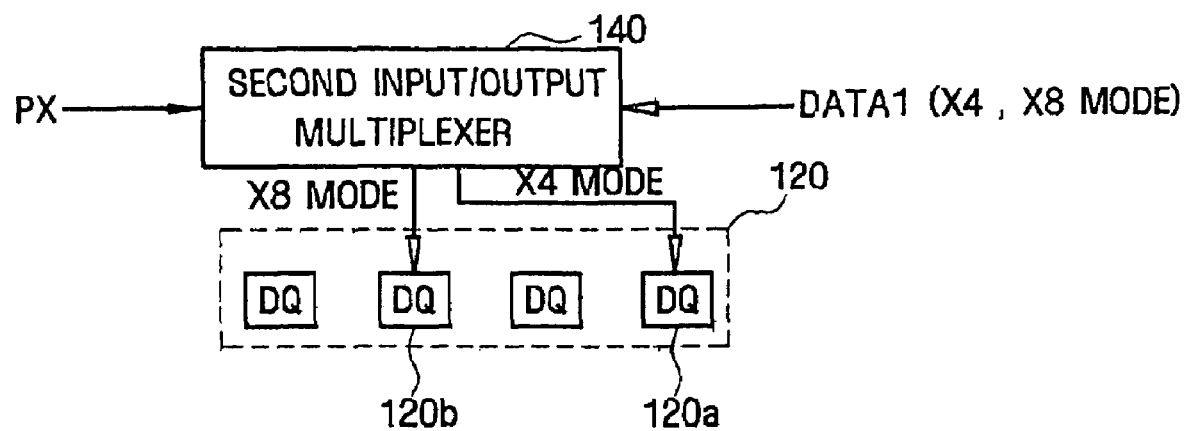

FIG. 2 shows a semiconductor memory device in accordance with an embodiment of the invention.

Referring to FIG. 2, a semiconductor memory device 100 in accordance with an embodiment of the invention comprises a first row of pads 110, a second rows of pads 120, and first and second input/output multiplexers 130 and 140.

First row of pads 110 comprises a first plurality of data input/output pads disposed in a row direction. Second row of pads 120 is physically separated from first row of pads 110 and comprises a second plurality of data input/output pads disposed in the row direction.

First input/output multiplexer 130 is associated with first row of pads 110. Further, first input/output multiplexer 130 receives a data input/output mode control signal PX. The data input/output mode of first input/output multiplexer 130 changes in accordance with data input/output mode control signal PX. When the data input/output mode of first input/output multiplexer 130 changes, the data input/output pad to which first input/output multiplexer 130 outputs data DATA0 (which is stored at a predetermined position of a memory cell array) changes. That is, changing the data input/output mode changes which data input/output pad first input/output multiplexer 130 outputs data DATA0 to. However, even when first input/output multiplexer 130 switches from outputting DATA0 from one data input/output pad to another, first input/output multiplexer 130 still provides data only to at least one of the data input/output pads of the first plurality of data input/output pads of first row of pads 110. For example, as shown in FIG. 2, data DATA0 is provided to a first data output pad 110a of first row of pads 110 in a ×4 mode, and data DATA0 is provided to a second data output pad 110b of first row of pads 110 in a ×8 mode.

Second input/output multiplexer 140 is associated with second row of pads 120. Further, second input/output multiplexer 140 receives data input/output mode control signal PX. The data input/output mode of second input/output multiplexer 140 changes in accordance with data input/output mode control signal PX. When the data input/output mode of second input/output multiplexer 140 changes, the data input/output pad to which second input/output multiplexer 140 outputs data DATA1 (which is stored at a predetermined position of the memory cell array) changes. However, even when second input/output multiplexer 140 switches from outputting DATA1 from one data input/output pad to another, second input/output multiplexer 140 still provides data only to at least one of the data input/output pads of the second plurality of data input/output pads of second row of pads 120. For example, as shown in FIG. 2, data DATA1 is provided to a third data output pad 120a of second row of pads 120 in the ×4 mode, and data DATA1 is provided to a fourth data output pad 120b of second row of pads 120 in the ×8 mode.

Since first and second input/output multiplexers 130 and 140 are operated as described above, a vertical bus for connecting first and second input/output multiplexers 130 and 140 is not used in the embodiment illustrated in FIG. 2. Therefore, because data DATA0 and DATA1 are not output through a vertical bus connected between first and second input/output multiplexers 130 and 140, no additional loading associated with being output through the vertical bus occurs, so input and output characteristics (for example, a frequency characteristic) of semiconductor memory device 100 (i.e., data DATA0 and DATA1), are improved.

Figure 3:
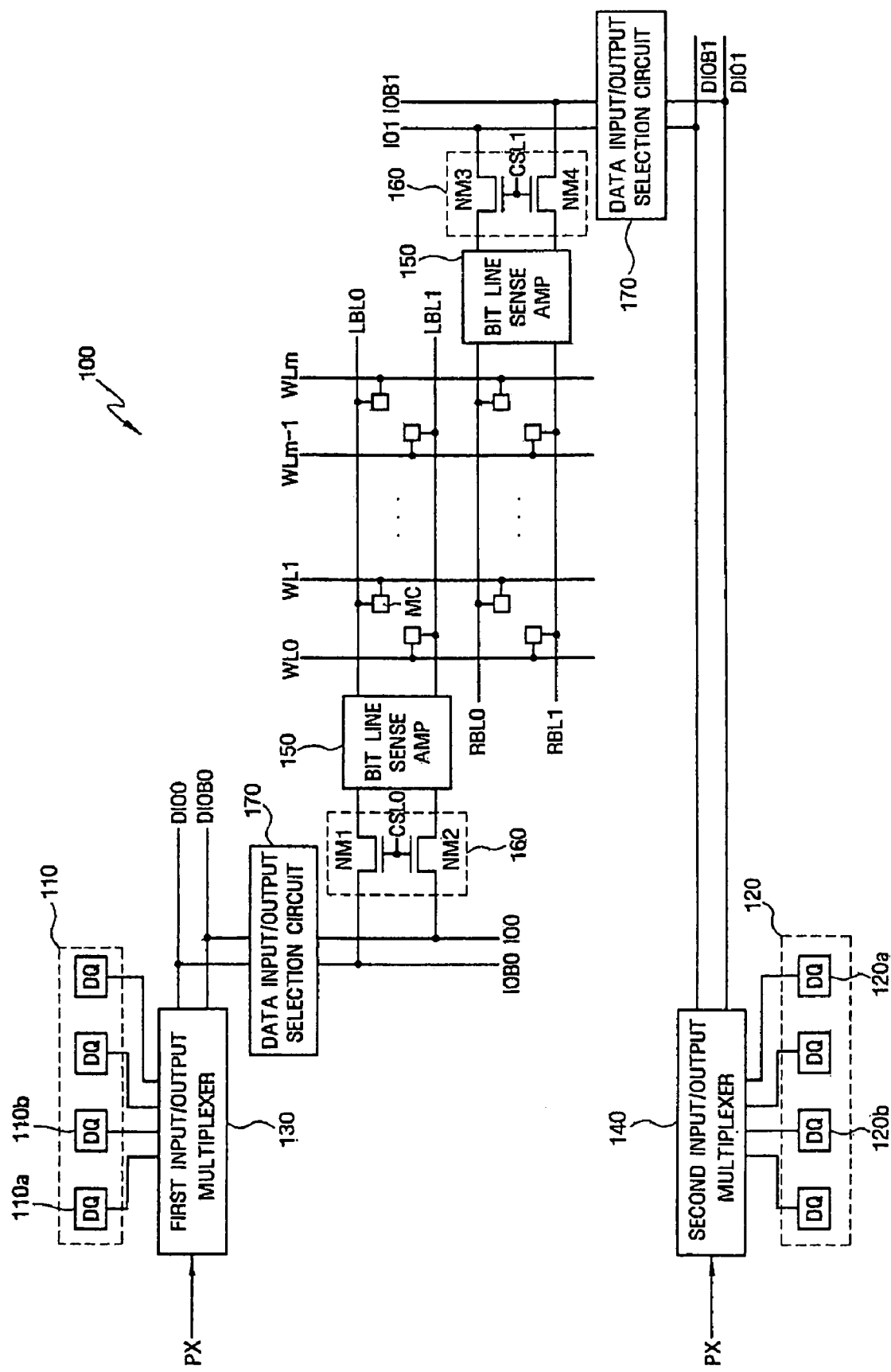
FIG. 3 shows the semiconductor memory device of FIG. 2 in some additional detail in accordance with an embodiment of the invention.
Figure 4:
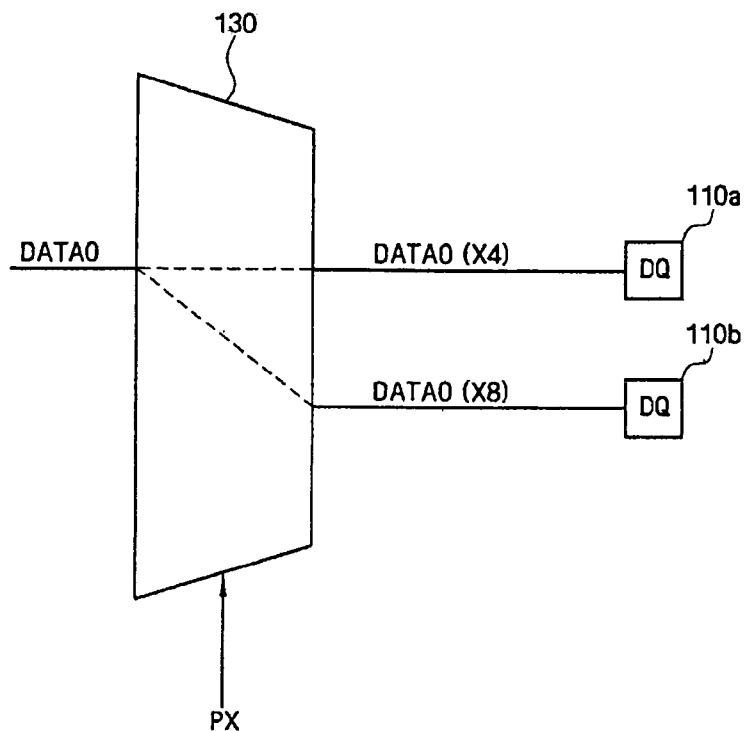
FIG. 4 shows an operation of a first input/output multiplexer of FIG. 3.

FIG. 3 shows the semiconductor memory device of FIG. 2 in some additional detail in accordance with an embodiment of the invention. FIG. 4 shows an operation of the input/output multiplexer of FIG. 3.

First, referring to FIG. 3, data stored in a memory cell MC of semiconductor memory device 100, in accordance with an embodiment of the invention, is provided to first input/output multiplexer 130 through a first pair of bit lines LBL0 and LBL1, a first pair of input/output lines IO0 and IOB0, and a first pair of data input/output lines DIO0 and DIOB0. Similarly, data stored in a memory cell MC of semiconductor memory device 100 in accordance with an embodiment of the invention is provided to second input/output multiplexers 140 through a second pair of bit lines RBL0 and RBL1, a second pair of input/output lines IO1 and IOB1, and a second pair of data input/output lines DIO1 and DIOB1.

A plurality of memory cells MC are disposed at intersections of word lines WL0, WL1, . . . , WLm−1, and WLm and bit lines LBL0, LBL1, RBL0, and RBL1. Each memory cell MC comprises a memory cell capacitor for storing data and an access transistor. For each memory cell MC, the access transistor of memory cell MC is disposed between the memory cell capacitor and the bit line among bit lines LBL0, LBL1, RBL0, and RBL1 that corresponds to memory cell MC. Also, for each memory cell MC, the access transistor of memory cell MC is gated by signals of the word line among word lines WL0, WL1, WLm-1, and WLm that corresponds to memory cell MC. The memory cell capacitors and the access transistors of memory cells MC are not shown in FIG. 3.

A first bit line sense amp 150 is connected to first pair of bit lines LBL0 and LBL1 and comprises a PMOS type sense amp and an NMOS type sense amp in order to develop data from first pair of bit lines LBL0 and LBL1. A second bit line sense amp 150 is connected to second pair of bit lines RBL0 and RBL1 and comprises a PMOS type sense amp and an NMOS type sense amp in order to develop data from second pair of bit lines RBL0 and RBL1. Each PMOS type sense amp develops data having a logic high level, and each NMOS type sense amp develops data having a logic low level. The PMOS type sense amps and the NMOS type sense amps are not shown in FIG. 3.

A first switching circuit 160 comprises a plurality of switching transistors NM1 and NM2 and responds to a column selection line signal CSL0 to electrically connect first pair of bit lines LBL0 and LBL1 and first pair of input/output lines IO0 and IOB0. Similarly, a second switching circuit 160 comprises a plurality of switching transistors NM3 and NM4 and responds to a column selection line signal CSL1 to electrically connect second pair of bit lines RBL0 and RBL1 and second pair of input/output lines IO1 and IOB1.

A first data input/output selection circuit 170 comprises a data recording driver and a sense amp. The data recording driver of first data input/output selection circuit 170 is operated to provide input data to first pairs of input/output lines IO0 and IOB0 during a write operation, and the sense amp of first data input/output selection circuit 170 is operated to provide output data to first pair of data input/output lines DIO0 and DIOB0 during a read operation. Similarly, a second data input/output selection circuit 170 comprises a data recording driver and a sense amp. The data recording driver of second data input/output selection circuit 170 is operated to provide input data to second pair of input/output lines IO1 and IOB1 during a write operation, and the sense amp of second data input/output selection circuit 170 is operated to provide output data to second pair of data input/output lines DIO1 and DIOB1 during a read operation.

First input/output multiplexer 130 is electrically connected to first pair of data input/output lines DIO0 and DIOB0 and first row of pads 110, but is electrically disconnected from second row of pads 120. Furthermore, even when the data input/output mode changes in accordance with data input/output mode control signal PX, first input/output multiplexer 130 provides output data only to at least one data input/output pad of first row of pads 110.

Second input/output multiplexer 140 is electrically connected to second pair of data input/output lines DIO1 and DIOB1 and second row of pads 120, but is electrically disconnected from first row of pads 110. Furthermore, even when the data input/output mode changes in accordance with data input/output mode control signal PX, second input/output multiplexer 140 provides output data only to at least one data input/output pad of second row of pads 120.

A read operation will now be described with reference to FIGS. 3 and 4. That is, an operation in which data stored in a memory cell MC connected to word line WL1 and bit line LBL0 is output will be described as an exemplary read operation.

During a standby period, word line WL1 is not selected and a column selection line signal CSL0 has a logic low level. When the read operation starts in accordance with an input read command, a word line driver (not shown) is driven so that word line WL1 is selected in accordance with a predetermined timing value. Accordingly, an electric charge that is stored in memory cell MC is provided to bit line LBL0. If the electric charge provided to bit line LBL0 from memory cell MC increases a difference in electric potential between bit line LBL0 and its complementary bit line LBL1, first bit line sense amp 150 develops the difference in electric potential.

Once the difference in electric potential between bit lines LBL0 and LBL1 of first pair of bit lines LBL0 and LBL1 is sufficiently developed by first bit line sense amp 150, column selection line signal CSL0 has a logic high level. Therefore, switching transistors NM1 and NM2 of first switching circuit 160 are turned on to electrically connect first pair of bit lines LBL0 and LBL1 and first pair of input/output lines IO0 and IOB0.

Subsequently, the sense amp of first data input/output selection circuit 170 amplifies the difference in electrical potential between input/output lines IO0 and IOB0 of first pair of input/output lines IO0 and IOB0 in order to provide data to first pair of data input/output lines DIO0 and DIOB0.

Subsequently, as shown in FIG. 4, first input/output multiplexer 130 provides output data to first data output pad 110a in the ×4 mode, and provides output data to a second data output pad 110b in the ×8 mode. As described above, first input/output multiplexer 130 may change which data input/output pad it outputs data to in accordance with the data input/output mode, but first input/output multiplexer 130 switches only between data input/output pads of first row of pads 110. That is, the only data input/output pads to which first input/output multiplexer 130 provides data are data input/output pads of the first row of pads.

Figure 5:
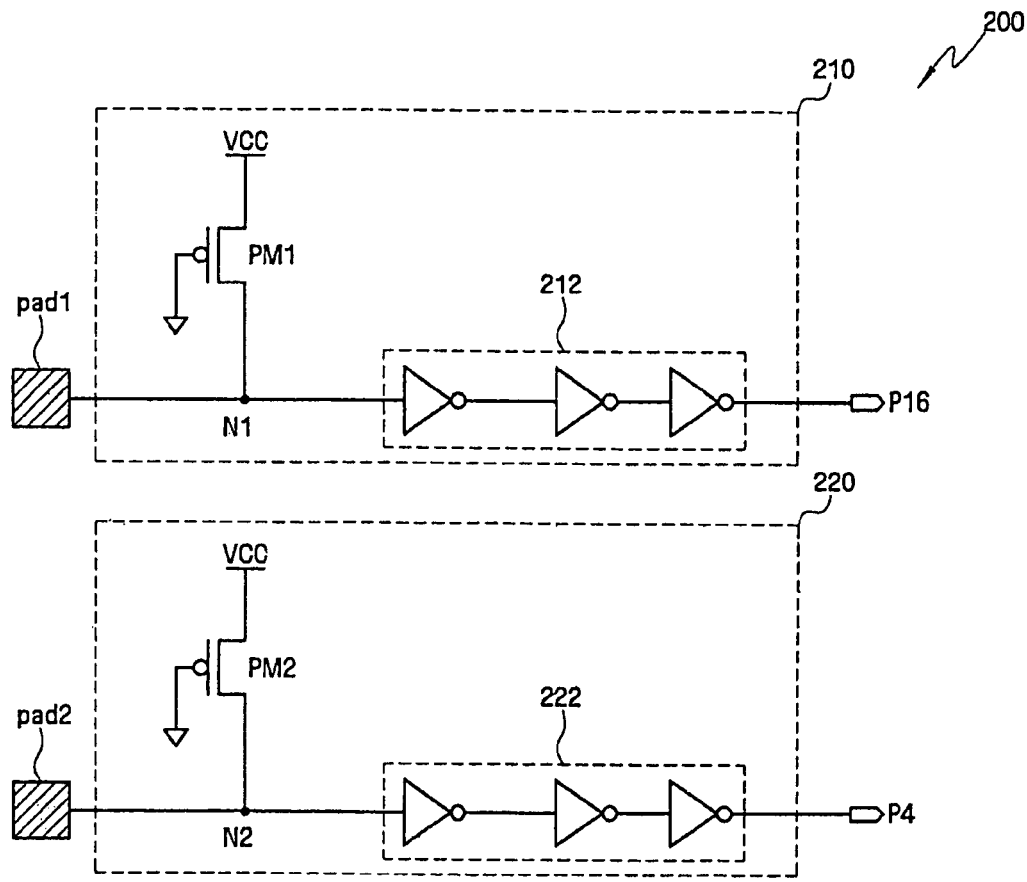
FIG. 5 is a circuit diagram showing a data input/output mode control circuit of the semiconductor memory device in accordance with an embodiment of the invention.

FIG. 5 is a circuit diagram showing a data input/output mode control circuit of the semiconductor memory device in accordance with an embodiment of the invention.

Referring to FIG. 5, a data input/output mode control circuit 200 comprises a first input/output mode setting circuit 210 and a second input/output mode setting circuit 220.

Data input/output modes corresponding to the respective logic levels of data input/output mode control signals P16 and P4 (which may be referred to herein as signal P16 and signal P4) are described in Table 1. For example, if signal P16 has a logic high level and signal P4 has a logic low level, the data input/output mode is a ×16 mode.

TABLE 1

| P16 | P4 | Data input/output mode |
|-----|----|-----------------------|
| H   | L  | ×16 mode              |
| L   | H  | ×4 mode               |
| L   | L  | ×8 mode               |

In order to provide the data input/output mode control signals P16 and P4 mentioned above, first input/output mode setting circuit 210 comprises a first pull-up element PM1 connected to a first pad pad1 and a power supply voltage VCC, and a first inverter chain 212 comprising a plurality of inverters connected to one another. Second input/output mode setting circuit 220 comprises a second pull-up element PM2 connected to a second pad pad2 and a power supply voltage VCC, and a second inverter chain 222 comprising a plurality of inverters connected to one another. First and second pull-up elements PM1 and PM2 may have a relatively poor driving capability.

Data input/output mode control circuit 200, in accordance with the embodiment of the invention, responds to voltage signals that are supplied from outside of data input/output mode control circuit 200 to generate the respective logic levels of data input/output mode control signals P16 and P4.

In more detail, if, during the fabrication of the semiconductor memory device, first pad pad1 is bonded to a package pin that receives a ground voltage, a node N1 is set to a ground voltage level. Thus, data input/output mode control signal P16 is set to a logic high level. However, if first pad pad1 is not bonded to a package pin, the voltage level of node N1 will be increased to a power supply voltage level through the operation of first pull-up element PM1, so data input/output mode control signal P16 will be set to a logic low level.

If second pad pad2 is bonded to the package pin that receives a ground voltage, a node N2 is set to the ground voltage level. Thus, data input/output mode control signal P4 is set to a logic high level. However, if second pad pad2 is not bonded to a package pin, the voltage level of node N2 is increased to the power supply voltage level through the operation of second pull-up element PM2. Thus, data input/output mode control signal P4 will be set to a logic low level. Alternatively, first and second pads pad1 and pad2 may be connected to different package pins, wherein the package pin to which first pad pad1 is connected receives a ground voltage and the package pin to which second pad pad2 is connected receives a ground voltage.

The PX signal of FIGS. 1 to 4 may be signal P16, signal P4, or a combination thereof.

Data input/output mode control signals P4 and P16 may be generated in accordance with whether or not one or more of first and second pads pad1 and pad2 is connected (i.e., bonded) to the package pin receiving the ground voltage when the semiconductor memory device is fabricated, as shown in FIG. 5, or may be generated in response to a separate control signal supplied from the outside of data input/output control circuit 200.

In a semiconductor memory device in accordance with an embodiment of the invention, even after a data input/output mode of the semiconductor memory device has changed, a first input/output multiplexer provides output data only to a first row of pads, and a second input/output multiplexer provides output data only to a second row of pads. Thus, it is possible to output data without using a vertical bus connecting first and second input/output multiplexers. Accordingly, since additional loading, which is performed when the vertical bus is used, does not occur in the semiconductor memory device in accordance with an embodiment of the invention, data input/output characteristics of the semiconductor memory device are improved.

Although embodiments of the invention have been described herein, various modifications and changes may be made to the embodiments by those skilled in the art without departing from the scope of the invention as defined by the accompanying claims.

What is claimed is:

1. A semiconductor memory device comprising:
a first row of pads comprising a first plurality of data input/output pads disposed in a row direction;
a second row of pads physically separated from the first row of pads and comprising a second plurality of data input/output pads disposed the row direction;
a first input/output multiplexer associated with the first row of pads and adapted to provide first output data only to at least one data input/output pad of the first row of pads, even after a data input/output mode of the semiconductor memory device has changed; and,
a second input/output multiplexer associated with the second row of pads and adapted to provide second output data only to at least one data input/output pad of the second row of pads, even after the data input/output mode has changed.

2. The semiconductor memory device of claim 1, wherein the first input/output multiplexer is electrically connected to the first row of pads and electrically disconnected from the second row of pads.

3. The semiconductor memory device of claim 2, wherein the first and second input/output multiplexers are electrically disconnected from each other.

4. The semiconductor memory device of claim 1, wherein the second input/output multiplexer is electrically connected to the second row of pads and electrically disconnected from the first row of pads.

5. The semiconductor memory device of claim 4, wherein the first and second input/output multiplexers are electrically disconnected from each other.

6. A semiconductor memory device comprising:
a first row of pads comprising a first plurality of data input/output pads disposed in a row direction;
a second row of pads physically separated from the first row of pads and comprising a second plurality of data input/output pads disposed the row direction;
a first input/output multiplexer electrically connected to the first row of pads and electrically disconnected from the second row of pads; and,
a second input/output multiplexer electrically connected to the second row of pads and electrically disconnected from the first row of pads.

7. The semiconductor memory device of claim 6, wherein the first input/output multiplexer is adapted to provide output data only to at least one data input/output pad of the first row of pads, even after a data input/output mode of the semiconductor memory device has changed.

8. The semiconductor memory device of claim 6, wherein the second input/output multiplexer is adapted to provide output data only to at least one data input/output pad of the second row of pads, even after a data input/output mode of the semiconductor memory device has changed.

9. The semiconductor memory device of claim 6, wherein the first and second input/output multiplexers are electrically disconnected from each other.

10. The semiconductor memory device of claim 6, further comprising a data input/output mode control circuit adapted to provide a data input/output mode control signal to the first and second input/output multiplexers,
wherein the data input/output mode control circuit comprises a first input/output mode setting circuit.

11. The semiconductor memory device of claim 10, wherein the data input/output mode control circuit further comprises a second input/output mode setting circuit.

12. The semiconductor memory device of claim 11, wherein the first input/output mode setting circuit comprises a first pull-up element and the second input/output mode setting circuit comprises a second pull-up element.

13. The semiconductor memory device of claim 12, wherein the first pull-up element is connected to a first pad and the second pull-up element is connected to a second pad.

14. The semiconductor memory device of claim 13, wherein the first input/output mode setting circuit further comprises a first inverter chain and the second input/output mode setting circuit further comprises a second inverter chain.

15. The semiconductor memory device of claim 14, wherein at least one of the first pad and the second pad is connected to a first package pin of the semiconductor memory device, wherein the first package pin is adapted to receive a ground voltage; or
the first pad is connected to the first package pin and the second pad is connected to a second package pin, wherein the first and second package pins are each adapted to receive the ground voltage.

16. A semiconductor memory device comprising:
a first row of pads comprising a first plurality of data input/output pads disposed in a row direction;
a second row of pads physically separated from the first row of pads and comprising a second plurality of data input/output pads disposed the row direction;
a data input/output mode control circuit adapted to generate a data input/output mode control signal in response to a voltage signal supplied from outside of the data input/output mode control circuit;
a first input/output multiplexer adapted to receive the data input/output mode control signal and, in accordance with the data input/output mode control signal, switch from providing data to a first set of at least one data input/output pad of the first row to providing data to a second set of at least one data input/output pad of only the first row; and,
a second input/output multiplexer adapted to receive the data input/output mode control signal and, in accordance with the data input/output mode control signal, switch from providing data to a first set of at least one data input/output pad of the second row to providing data to a second set of at least one data input/output pad of only the second row.

17. The semiconductor memory device of claim 16, wherein the first input/output multiplexer is electrically connected to the first row of pads and electrically disconnected from the second row of pads.

18. The semiconductor memory device of claim 17, wherein the first and second input/output multiplexers are electrically disconnected from each other.

19. The semiconductor memory device of claim 16, wherein the second input/output multiplexer is electrically connected to the second row of pads and electrically disconnected from the first row of pads.

20. The semiconductor memory device of claim 19, wherein the first and second input/output multiplexers are electrically disconnected from each other.

* * * * *